(12) United States Patent  
Nazarian et al.

(10) Patent No.: US 8,832,408 B2  
(45) Date of Patent: Sep. 9, 2014

(54) NON-VOLATILE MEMORY ARRAY PARTITIONING ARCHITECTURE AND METHOD TO UTILIZE SINGLE LEVEL CELLS AND MULTI-LEVEL CELLS WITHIN THE SAME MEMORY

(75) Inventors: Hagop Nazarian, San Jose, CA (US); Ali Pourkeramati, Hills, CA (US)

(73) Assignee: Spansion LLC, Sunnyvale, CA (US)

( * ) Notice: Subject to any disclaimer, the term of this patent is extended or adjusted under 35 U.S.C. 154(b) by 618 days.

(21) Appl. No.: 11/928,865

(22) Filed: Oct. 30, 2007

(65) Prior Publication Data

US 2009/0113115 A1    Apr. 30, 2009

(51) Int. Cl.
*G06F 12/00* (2006.01)
*G11C 16/08* (2006.01)
*G11C 11/56* (2006.01)

(52) U.S. Cl.
CPC ............ *G11C 11/5621* (2013.01); *G11C 16/08* (2013.01); *G11C 2211/5641* (2013.01)
USPC ............................. 711/173; 711/100; 711/154

(58) Field of Classification Search
CPC .. G06F 12/0646; G06F 3/0629; G06F 3/0644
USPC ......................................... 711/173, 100, 154
See application file for complete search history.

(56) References Cited

U.S. PATENT DOCUMENTS

| 4,918,641 | A | * | 4/1990 | Jigour et al. | ................... 708/232 |
| 5,046,035 | A | * | 9/1991 | Jigour et al. | ................... 708/232 |
| 5,930,167 | A | * | 7/1999 | Lee et al. | ................. 365/185.03 |
| 7,113,431 | B1 | | 9/2006 | Hamilton et al. | |
| 2002/0172075 | A1 | * | 11/2002 | Park et al. | ................. 365/185.18 |
| 2007/0211530 | A1 | * | 9/2007 | Nakano | .................... 365/185.08 |

FOREIGN PATENT DOCUMENTS

| EP | 0 788 113 A1 | 1/1996 |
| EP | 0788113 A1 * | 9/1997 |
| JP | 2007242163 A * | 9/2007 |
| WO | WO 84/04983 | 12/1984 |

OTHER PUBLICATIONS

IPCOM000140892D; IP.com; Sep. 25, 2006.*
NAND vs. NOR flash technology; Tal, Arie; M-Systems; Feb. 2002.*
Flash Memory Technology; AllMemoryCards.com; Feb. 25, 2006.*
Machine translation of JP 2007242163A (Nakano); AIPN.*

* cited by examiner

*Primary Examiner* — Tuan Thai
(74) *Attorney, Agent, or Firm* — Sterne, Kessler, Goldstein & Fox P.L.L.C.

(57) ABSTRACT

A memory device is disclosed, and includes an array of memory cells and a partitioning system configured to address a first portion of the array in a single level cell mode, and a second portion of the array in a multi-level cell mode.

8 Claims, 7 Drawing Sheets

NON-VOLATILE MEMORY ARRAY PARTITIONING ARCHITECTURE AND METHOD TO UTILIZE SINGLE LEVEL CELLS AND MULTI-LEVEL CELLS WITHIN THE SAME MEMORY

FIELD OF INVENTION

The invention is generally related to the field of memory devices and more particularly to devices, architectures and methods associated with single level and multi-level non-volatile memory cells.

BACKGROUND OF THE INVENTION

Many different types and styles of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Flash NOR memory is generally constructed of many memory cells where, generally, single bits of data are stored in and read from respective memory cells. The cells are generally programmed by hot electron injection and erased by Fowler-Nordheim tunneling or hot hole injection, however other mechanisms of programming and/or erasing can be employed.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

The memory cell generally has a source, a drain, and a channel formed there between, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multi-layer insulator such as an oxide-nitride-oxide (ONO) layer having two oxide layers sandwiching a nitride layer. Lastly, a polysilicon control gate overlies the interpoly dielectric layer.

In a NOR configuration, the control gate is connected to a wordline associated with a row of memory cells to form sectors of such cells. In addition, the drain regions of the cells are connected together by a conductive bitline. The channel of the cell conducts current between the source and the drain in accordance with an electric field developed in the channel by the stacked gate structure. Respective drain terminals of the transistors within a single column are connected to the same bitline. In addition, respective flash cells associated with a given bitline have slacked gate terminals coupled to a different wordline, while all the flash memory cells in the array generally have their source terminals coupled to a common source terminal. In operation, individual flash cells are addressed via the respective bitline and wordline using the peripheral decoder and control circuitry for programming (writing), reading or erasing functions.

By way of further detail, the single bit stacked gate flash memory cell is programmed by a suitable mechanism, such as hot electron injection. Programming with hot electron injection involves applying a relatively high voltage to the control gate and connecting the source to ground and the drain to a predetermined potential above the source. When a resulting electric field is high enough, electrons collect enough energy to be injected from the source onto the control gate. As a result of the trapped electrons, the threshold voltage of the cell increases. This change in the threshold voltage (and thereby the channel conductance) of the cell created by the trapped electrons is what causes the cell to be programmed.

In order to erase a typical single bit slacked gate flash memory cell, a relatively high voltage is applied to the source, and the control gate is held at a negative potential, while the drain is allowed to float. Under these conditions, a strong electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

For a read operation, a certain voltage bias is applied across the drain to source of the cell transistor. The drain of the cell is the bitline, which may be connected to the drains of other cells in a byte or word group. A source read voltage is applied at the source and a drain read voltage is applied at the drain. The drain read voltage is greater than the source read voltage. A read gate voltage is then applied to the gate (e.g., the wordline) of the memory cell transistor that is greater than the drain read voltage in order to cause a current to flow from the drain to source. The read operation gate voltage is typically applied at a level between a programmed threshold voltage (Vt) and an unprogrammed threshold voltage. The resulting current is measured, by which a determination is made as to the data value stored in the cell.

Another type of flash memory is dual bit memory, which allows multiple bits to be stored in a single cell. In this technology, a memory cell is essentially split into two identical, complementary parts, each of which is formulated for storing one of two independent bits. Each dual bit memory cell, like a traditional cell, has a gate with a source and a drain. However, unlike a traditional slacked gate cell in which the source is always connected to an electrical source and the drain is always connected to an electrical drain, respective dual bit memory cells can have the connections of the source and drain reversed during operation to permit the storing of two bits.

In a virtual ground type architecture, dual bit memory cells have a semiconductor substrate with conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines. Programming circuitry controls two bits per cell by applying a signal to the wordline, which acts us a control gate, and changing bitline connections such that one bit is stored by the source and drain being connected in one arrangement and a complementary bit is stored by the source and drain being connected in another arrangement.

In a NAND type architecture, individual memory cell (which single bit stacked gate, or dual bit memory cells) are arranged in a serially-coupled string, with select transistor devices on top and bottom portions of the serial string that form a bit line. Each cell gate terminal is coupled to a unique word line. By appropriate addressing of the various word lines, individual memory cells along the serial string may be addressed.

In each of the various architectures highlighted above, each bit of the memory cell may be one of two distinct states, for example, a "0" or a "1" state. These types of memory cells are often referred to a single level cells (SLC), wherein the state of the cell may be ascertained by comparing the cell data to a reference cell having a single state that resides somewhere between the two distinct data states. By comparing the current in the programmed cell to a reference current of a reference data cell, the state of the bit at issue may be determined.

Another conventional form of non-volatile memory that use the above stacked gate or dual bit device structures is often referred to as a multi-level cell (MLC). In a multi-level memory cell a single physically distinct data bit may have more than two distinct states. For example, one type of common multi-level memory cell is referred to as a quad bit cell since each physical bit may be one of four distinct data states. Therefore in a conventional stacked gate type memory structure, the single bit may be one of multiple data states greater than two. Similarly, in a dual bit type memory structure, each of the two physically distinct data bits may be one of multiple data states. Such memory cells are often referred to as a multi-level cell. In order to ascertain the data state of each physically distinct bit, the current associated therewith is compared with multiple reference currents associated with multiple reference data cells.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the invention in a simplified form as a prelude to the more detailed description that is presented later.

In accordance with one aspect of the invention, a memory device is disclosed. The memory device comprises an array of memory cells and a partitioning system configured to address a first portion of the array in a single level cell mode, and a second portion of the array in a multi-level cell mode.

In another aspect of the invention, a memory comprises an array of memory cells and a configurable partitioning system. The partitioning system is configured to partition the array into first and second portions based on a configurable instruction, wherein the first array portion is addressed differently than the second array portion.

In still another aspect of the invention a method of transferring data having a first addressing format in a first portion of a partitioned non-volatile memory to a second portion of the memory having a second addressing format is disclosed. The method comprises transferring the data into a temporary storage location, and transferring the data from the temporary storage location to the second portion of the memory, wherein a data storage density in the second portion is different than that in the first portion.

The following description and annexed drawings set forth in detail certain illustrative aspects and implementations of the invention. These are indicative of but a few of the various ways in which the principles of the invention may be employed.

DETAILED DESCRIPTION OF THE INVENTION

One or more implementations of the present invention will now be described with reference to the drawings, wherein like reference numerals are used to refer to like elements throughout. The invention is directed to a memory having a partitioning system and associated methods of operation.

Figure 1:
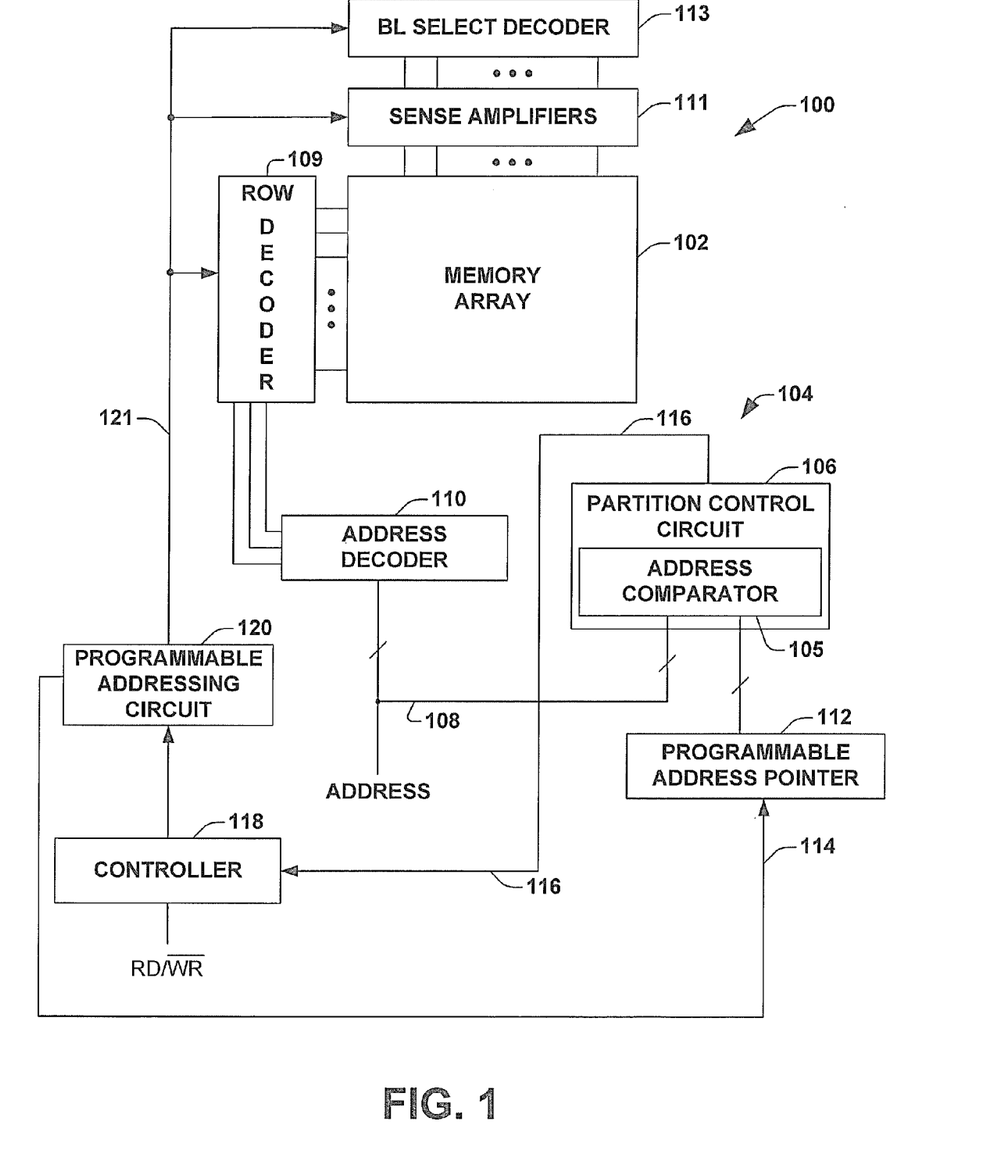
FIG. 1 is a block diagram illustrating a memory device having a partitioning system for addressing memory cells therein selectively in a single level and multi-level mode of operation, according to one aspect of the invention.

According to one aspect of the invention, a memory device is provided that includes a partitioning system that is configured to address one or more memory cells within a memory array in different modes. In one exemplary embodiment, as illustrated in FIG. 1 generally at reference numeral 100, a memory includes a memory array 102. In one embodiment, the memory array 102 comprises a non-volatile memory array of flash memory cells such as single bit stacked gate cells or dual bit type cells. Alternatively, other types of flash cells may be employed and all such alternatives are contemplated as falling within the scope of the present invention. In addition, the memory cells within the array may be organized within a NOR, NAND, virtual ground, or other type architecture, and all such architectures are contemplated by the invention. Further, in the present example, all the memory cells are of the same type and are in the same architecture, however, the invention is not so limited. Rather, the array 102 may comprise different types of cells and even different types of architectures.

Still referring to FIG. 1, the memory 100 comprises a partitioning system 104. The partitioning system 104 is configured to partition the entire array, or part of the array, into first and second portions. In one example, the system 104 effectuates such partitioning based on a configurable instruction, and such partitioning results in the partitioned portions being addressed differently from one another. For example, the partitioning system 104 is configured to partition the array 102 into first and second portions, wherein the first portion is addressed in a single level mode of operation, while the second portion is addressed in a multi-level mode of operation. In alternative embodiments of the invention, partitioning may occur to define more than two portions, and may include greater than two different modes of operation, and such alternatives are contemplated as falling within the scope of the present invention.

In one embodiment of the invention, the partitioning system 104 comprises a partition control circuit 106 having an address comparator 105 that is operably associated with the memory array 102. The partition control circuit 106 receives an address 108 that is associated with the array 102 when a memory operation is to be performed. Such an operation is sometimes referred to as addressing the memory, and may include a read (RD) operation and a write (WR) operation (wherein a write operation includes, in one example, the writing of data to the cell or an erase of information of multiple memory cells).

The partitioning system 104 further comprises an address decoder 110 and a programmable address pointer (PAP) register 112. The PAP register 112 may be a location within the array in one embodiment, or may alternatively comprise a separate memory location. In one embodiment of the invention, the PAP register 112 is preferably a non-volatile memory. The PAP register 112 receives a pointer address 114, in one embodiment, and such address is stored therein. In one embodiment, such address pointer is programmable, and may be provided by a user or partitioning controller 118 and/or programming circuit 120, as may be desired. In one embodiment of the invention the partition control circuit 106 includes an address comparator and compares the received address 108 with the address pointer 114 stored in the register 112 and generates a control signal 116 in response thereto. The control signal 116 controls, at least in part, the controller 118 in order to selectively generate one or more programming signals 121 via, for example, the programmable addressing circuit 120 to appropriately address the memory array 102 via the row decoder 109 and bit line select decoder 113, for example. That is, if the address operation signal RD/WR(bar) to the controller 118 indicates a write operation, the control signal 116 indicates whether the address at issue is partitioned in a portion of the array 102 constituting a single bit memory cell or a multi-bit memory cell, and based on that determination the programming signals 121 are appropriate for that portion of the array. Therefore based on the control signal 116, the controller 118, either alone or in conjunction with a programmable addressing circuit 120, row decoder 109 and bit line select decoder 113 effectuates the desired operation (RD/WR, and single bit or multi bit addressing) at the memory cell in the array 102 associated with the address 108 according to the manner in which the array 102 has been partitioned.

Figure 2:
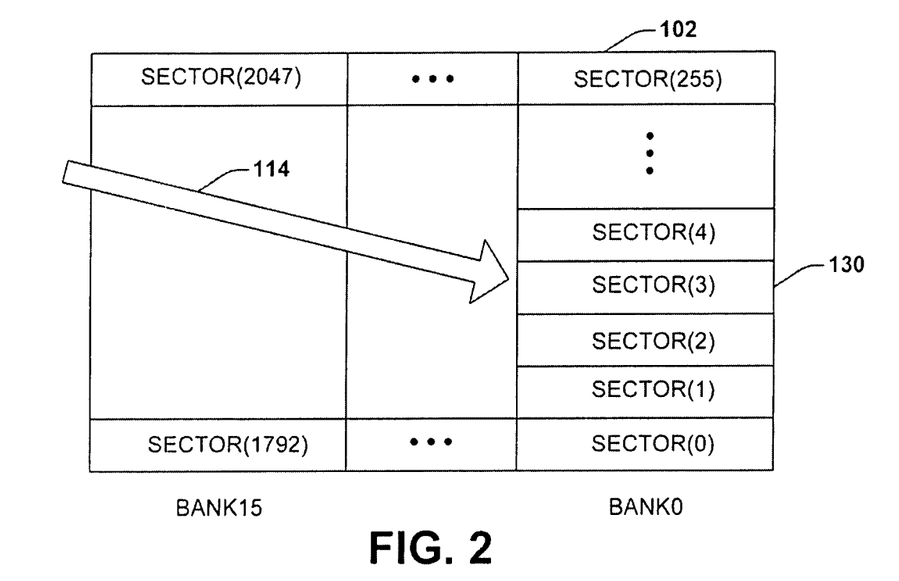
FIG. 2 is a depiction of a portion of a memory array, wherein a programmable address pointer points to an address therein according to an aspect of the invention.
Figure 3:
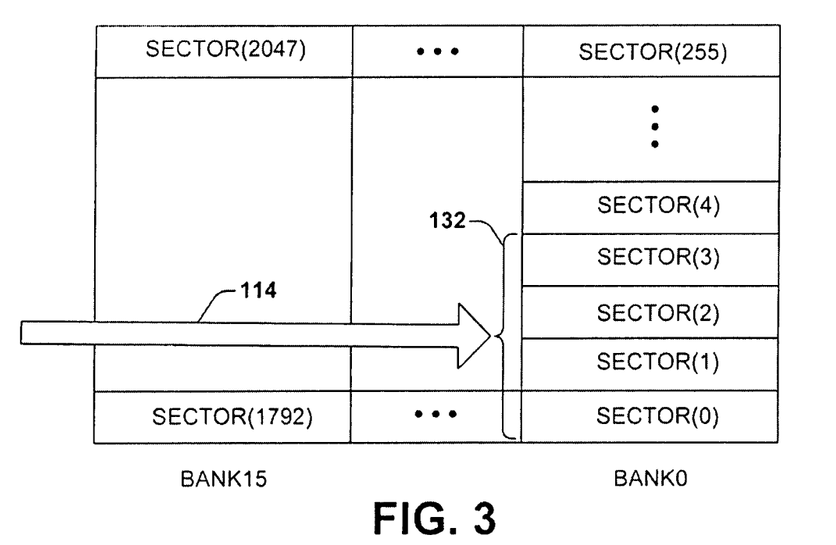
FIG. 3 is a depiction of the memory array portion of FIG. 2, wherein the programmable address pointer has partitioned the array into first and second portions corresponding to single level and multi-level portions, according to another aspect of the invention.

One exemplary embodiment illustrating a partitioning of the memory array 102 of FIG. 1 is illustrated in FIGS. 2 and 3. FIG. 2 illustrates an exemplary portion of the memory array, wherein sixteen (16) banks of two hundred fifty-six (256) sectors each are arranged as shown. In this example, the granularity of the memory array is provided at the sector level, however, it should be appreciated that larger or smaller granularities are contemplated by the present invention. In FIG. 2, the address pointer 114 points to an address associated with sector(3) 130 in the array 102. In one embodiment of the invention, as illustrated in FIG. 3, the partition control circuit 106 of FIG. 1 treats the entire array 102 as a default multi-level operation mode, and those sectors 132 with addresses less than the address pointer 114 are partitioned and will be addressed in another operation mode, such as the single level operation mode.

In another alternative embodiment of the invention the default mode may be different, however, in the above example such configuration is advantageous since the multi-level operation mode provides for greater storage density of data within the array.

A multi-level memory cell comprises one or more physically distinct bits that itself can represent one of more than two data states. For example, by injecting differing amounts of charge into a bit location in a controlled fashion, the resultant threshold voltage (Vt) of the device can be varied to, for example, four (4) different, distinct levels. In such an embodiment such a memory may be referred to as a quad bit cell, since each physical bit may represent one of four distinct states.

With a multi-level operation mode, the programmable addressing circuit 120 of FIG. 1 performs read and write operations on cells in the array 102 differently than for a single level operation mode. For example, in a multi-level mode, a bit may be one of four distinct data states. Therefore, in one embodiment of the invention, the sense amplifier circuitry 111 compares a current in the cell being read to a plurality of reference currents (e.g., three (3) to detect four (4) distinct data levels) typically associated with reference data cells in order to ascertain the appropriate data state, in performing a write operation the programmable addressing circuit 120 is configured, via appropriate word line voltages coupled via the row decoder 109 and bit line voltages coupled via the bit line select decoder 113 to control the amount of charge transferred to the selected bit location in a controlled fashion so as to obtain one of four distinct levels of charge thereat. Lastly, if the write operation comprises an erase, the programmable addressing circuit 120 may perform an erase sequence via the appropriate circuitry.

For the single level cell operation mode, the sense amplifier circuitry 111 of FIG. 1 performs a read operation by comparing the current of the interrogated cell (address 108) with a single reference current. Based on whether the read current is greater than or less than the reference current, the binary state of the data may be ascertained. To write data to the selected memory cell, the programmable addressing circuit 120 couples the appropriate voltages to the requisite word line and bit lines to control an amount of charge to the selected bit location to obtain one of two available data states. While the above functionalities of the circuit 120 are provided to illustrate one exemplary manner in which the memory array 102 may be partitioned, it should be appreciated that other functions may be employed and all such variations are contemplated as falling within the scope of the invention.

While partitioning of a memory according to the present invention may be performed for any reason without limitation, one exemplary advantage of partitioning provides a user with flexibility in allocating a first portion of the array to a single level addressing mode for sensitive data such as firmware, BIOS data, configuration data, etc., while the second portion operates in the multi-level operation mode and holds user data files, etc, that may need higher data storage density. In general, data that needs to meet high reliability standards with respect to cycling and retention may advantageously be maintained in the single level portion of an array, in one embodiment.

Figure 4:
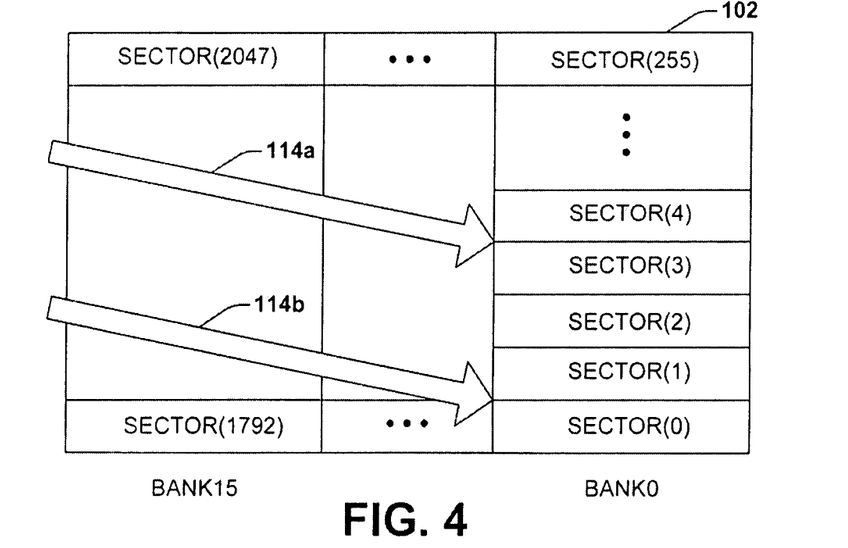
FIG. 4 is a depiction of a portion of a memory array, wherein two programmable address pointers point to addresses therein according to an aspect of the invention.

In accordance with another embodiment of the invention, more than one programmable address pointer (PAP) 114 may be employed to partition the memory array 102 in a variety of different ways. As illustrated in FIGS. 1 and 4, the register or memory location 112 may store a plurality of pointers (PAP) 114, for example, two pointers 11.4a and 114b.

Figure 5:
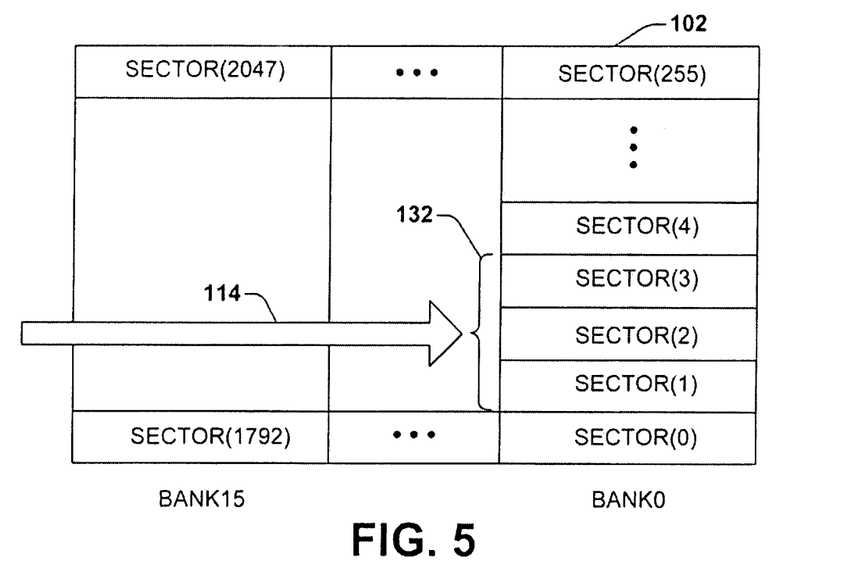
FIG. 5 is a depiction of the memory array portion of FIG. 4, wherein the programmable address pointers have partitioned the array into first and second portions corresponding to single level and multi-level portions, according to another aspect of the invention.

As shown in FIGS. 4 and 5, having two pointers 114a and 114b allows greater flexibility in partitioning a first portion 132 from a second portion (e.g., the remaining portion of the array 102). Referencing FIG. 1, when an operation is to be performed in the array, the partition control circuit 106 receives the address 108 associated with the memory cell location in the array, and compares that address to the two programmable address pointers (PAP) 114a and 114b provided thereto. Based on whether or not the address 108 falls between the address pointers, the partition control circuit 106 provides a control signal 116 to enable appropriate addressing signals via the programmable addressing circuit 120.

While embodiments are discussed herein using one and two programmable address pointers, respectively, it should be understood that the present invention contemplates use of multiple address pointers, and all such variations are contemplated as falling within the scope of the invention.

Figure 6:
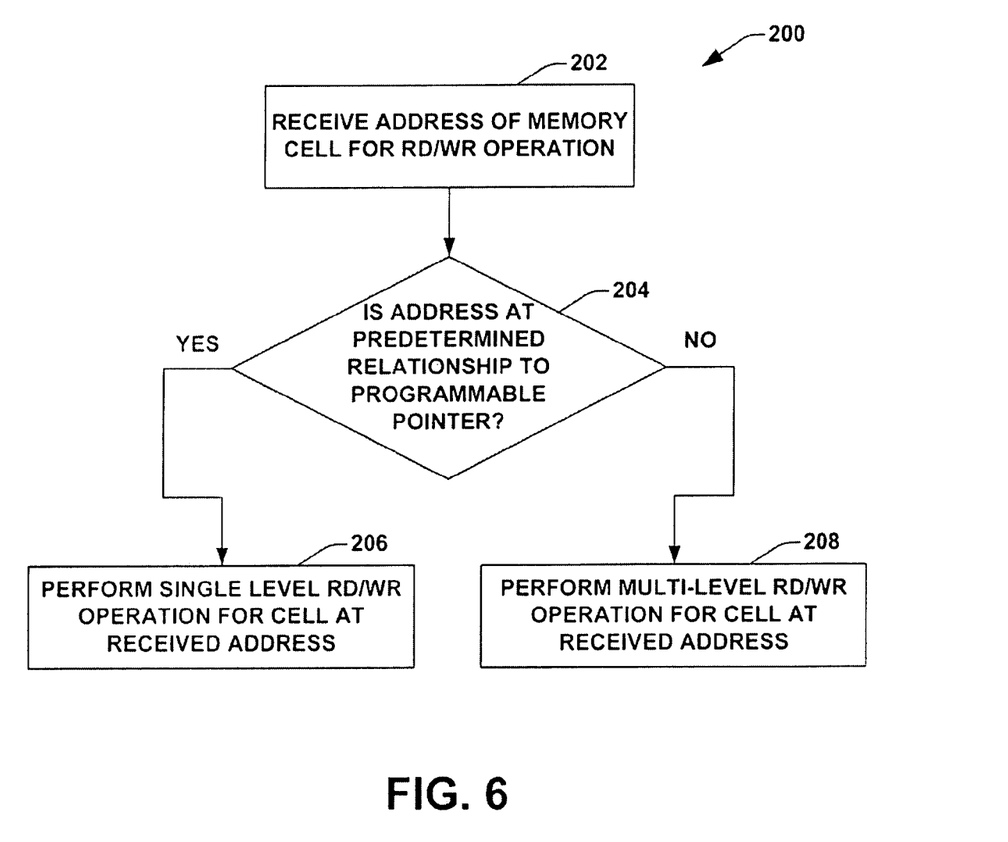
FIG. 6 is a flow chart illustrating a method of partitioning a memory array into first and second portions corresponding to single level and multi-level portions, according to still another aspect of the invention.

According to another embodiment of the invention, a method 200 of performing an operation in conjunction with a partitioned memory is illustrated in FIG. 6. Although the method 200 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and systems illustrated and described herein as well as in association with other structures not illustrated.

The method 200 begins at 202 with receipt of an address (e.g., address 108 of FIG. 1) associated with a memory cell within the array 102 for performance of a read or write operation thereto. An analysis, evaluation or query is made at 204 to determine whether the received address at 202 satisfies or contains a predetermined relationship with respect to a programmable address pointer value.

If at 204 the predetermined relationship is satisfied (YES), the method 200 proceeds to 206, wherein a single level cell address operation is performed on the selected cell based on whether the operation is specified as a read or a write. In accordance with one embodiment of an invention, a control signal selectively enables circuitry (e.g., the programmable addressing circuit 120, row decoder 109 and bit line select decoder 113 of FIG. 1) to perform the single level cell operation. If, however, at 204 the predetermined relationship is not established (NO), the method 200 proceeds to 208, wherein a multi-level cell operation is performed on the memory cell associated with the address 108.

In one embodiment of the invention, the predetermined relationship is evaluated at 204 by comparing the address 108 received at 202 with the programmable address pointer (PAP) 114. In one example, if the address is less than or equal to PAP, the single level addressing mode of operation is utilized. However, as may be appreciated, other predetermined relationships may be employed and such alternatives are contemplated as falling within the scope of the present invention. In addition, while 204 may entail evaluating a predetermined relationship with respect to a single programmable address pointer, the invention also contemplates evaluating a predetermined relationship with respect to two or more programmable address pointers.

Figure 7:
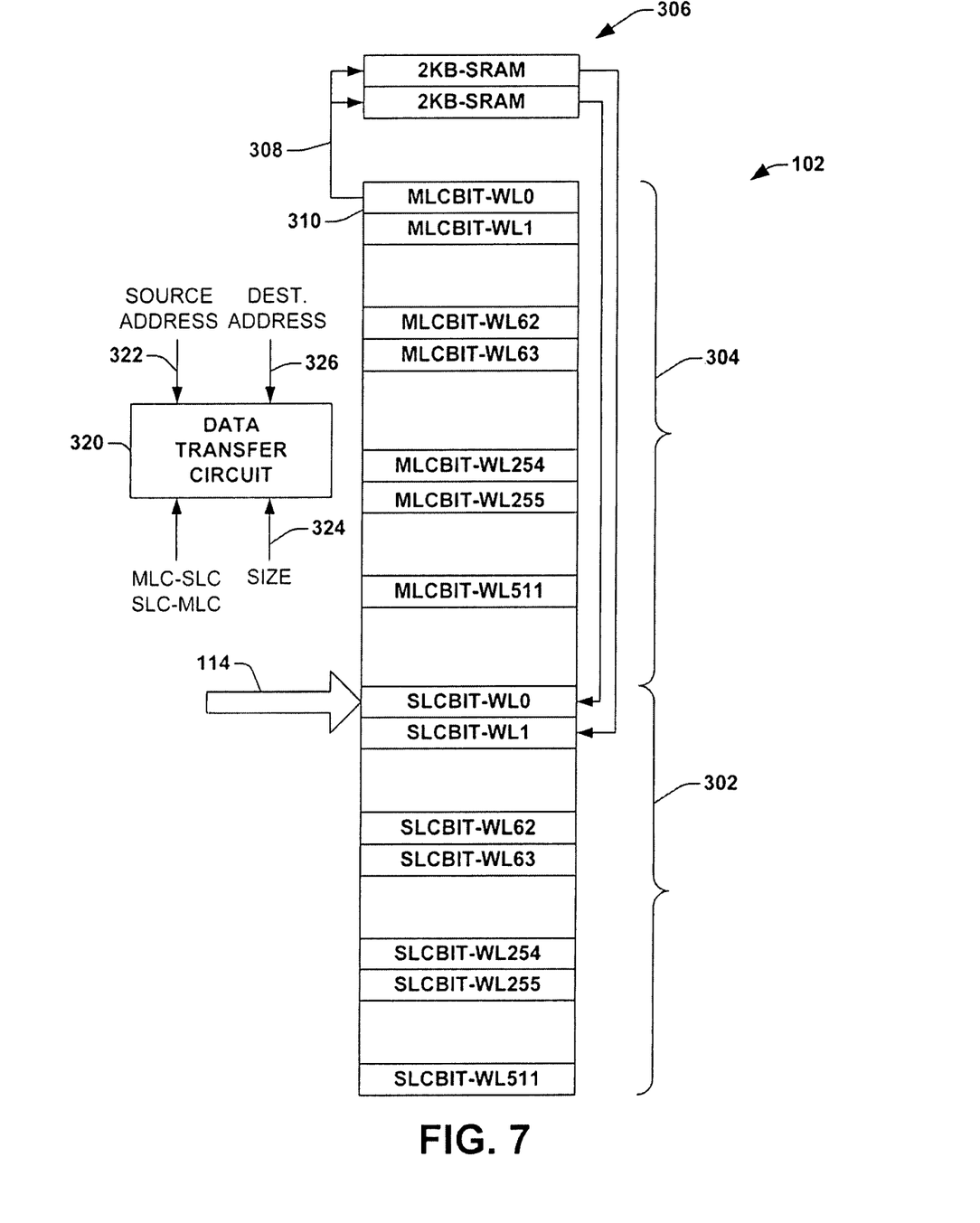
FIG. 7 is a depiction of a portion of a memory array, wherein data is transferred from a multi-level portion of a partitioned memory array to a single level portion, according to yet another aspect of the invention.

In accordance with another embodiment of the invention, data that resides in a first portion of a partitioned array may be transferred to a second portion of the array, or vice-versa. One embodiment in which data stored in a second portion that is partitioned for multi-level cell (MLC) addressing is transferred to the first portion partitioned for single level cell (SLC) addressing is illustrated in FIG. 7. FIG. 7 shows a portion of a non-volatile flash memory array 102, wherein a programmable address pointer 114 points to an address location that effectively partitions the array into a first portion 302 and a second portion 304, respectively.

According to one embodiment of the invention, an additional memory 306 is provided, for example, an SRAM memory, wherein data is transferred from the second portion 304 to the first portion 302 in the following manner. In one example, a page comprising 4 KB of data stored in a multi-level cell arrangement (e.g., quad bit) is transferred to 4 KB of SRAM 306, for example, an internal SRAM, as illustrated at 308. The SRAM 306 serves as a temporary storage location, or cache type memory. As illustrated in the example of FIG. 7, the SRAM operates as a single level cell type memory, and thus one page of quad bit memory at 310 occupies two pages of SRAM memory 306.

As further illustrated in FIG. 7, the above transfer may be effectuated with an internal data transfer circuit 320 associated with the memory array 102, wherein a data state of one physical bit is read from the quad bit location 308 and transposed into two corresponding physical bits of SLC data, that are then written to or programmed into the SRAM 306. The data transfer circuit 320 thus receives the source quad bit address 322 and the data transfer size 324, as well as the destination address 326 within the SLC or first portion 302.

Figure 8:
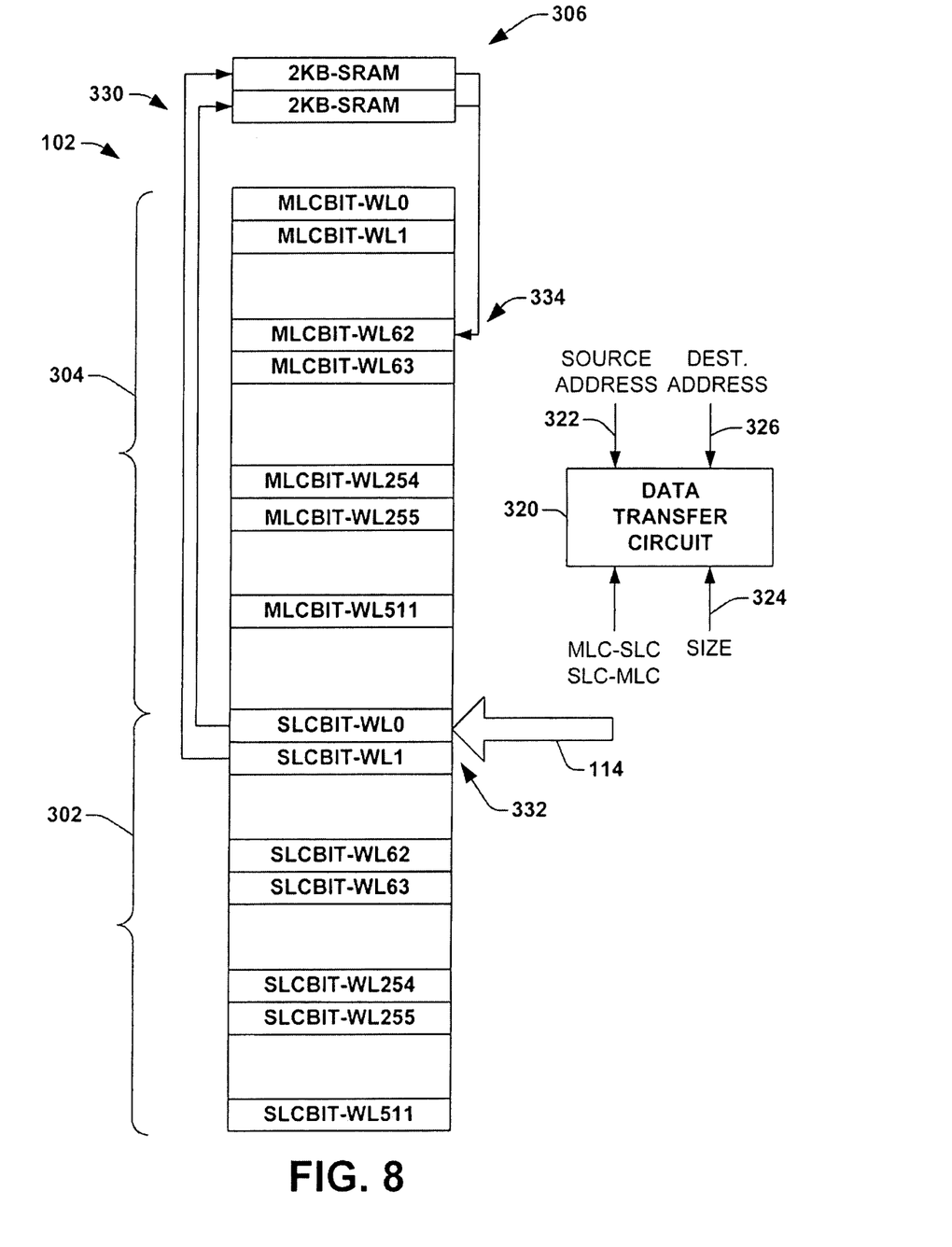
FIG. 8 is a depiction of a portion of a memory array, wherein data is transferred from a single level portion of the partitioned memory array to a multi-level portion, according to yet another aspect of the invention.

In accordance with another embodiment of the invention, data stored in a first portion that is partitioned for single level cell (SLC) addressing is transferred to the second portion partitioned for multi-level cell (MLC) addressing as illustrated in FIG. 8. FIG. 8 shows a portion of a non-volatile flash memory array 102, wherein the programmable address pointer 114 points to an address location that effectively partitions the array into the first portion 302 and the second portion 304, respectively.

According to one embodiment of the invention, the additional memory 306 is provided, for example, an SRAM memory, wherein data is transferred from the first portion 302 to the second portion 304 in the following manner. In one example, two pages of 2 KB of data each are stored in the single level cell arrangement, and is transferred to 4 KB of SRAM 306, for example, an internal SRAM, as illustrated at 330. The SRAM 306 serves as a temporary storage location, or cache type memory. As illustrated in the example of FIG. 8, the SRAM operates as a binary state type memory, and thus two pages of single level type memory at 332 occupies two pages of SRAM memory 306.

As further illustrated in FIG. 8, the above transfer may be effectuated with an internal data transfer circuit 320 associated with the memory array 102, wherein a data state of two physical bits are read from the single level bit locations 332 and transposed into one corresponding physical bits of MLC data. This is accomplished by first transferring the bits into the SRAM, and then transferring the data to the multi-level cell location 334. The data transfer circuit 320 thus receives the source quad bit address 322 and the data transfer size 324, as well as the destination address 326 within the MLC or second portion 304.

Figure 9:
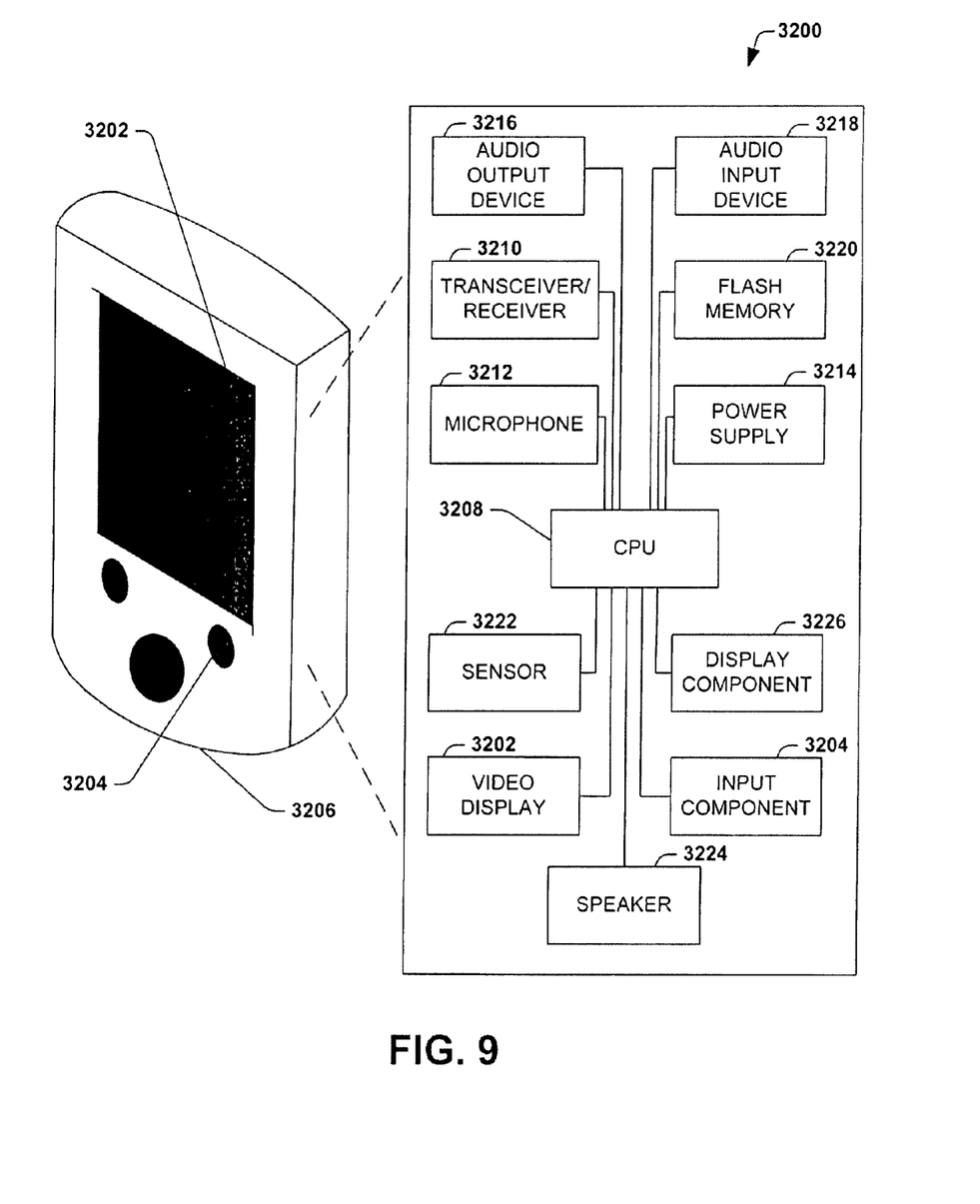
FIG. 9 is an isometric view of a device and block diagram according to yet one or more aspects of the present invention.

FIG. 9 is an exemplary portable electronic device, for example, a Personal Data Assistant (PDA) 3200 that may incorporate the memory and methods of the present invention. The PDA 3200 comprises a video display 3202, an input component 3204, a housing 3206, a CPU 3208, a transceiver and/or a receiver 3210, a microphone 3212, a power supply 3214, an audio output device 3216, an audio input 3218, flash memory 3220, various sensors 3222, and speaker(s) 3224. The flash memory 3220 utilizes a memory 100 with partitionable memory array 102 as highlighted in FIG. 1, for example. The audio input device 3218 can be a transducer, for example. The input component 3204 can include a keypad, buttons, dials, pressure keys, and the like. The video display 3202 can be a liquid crystal display, a plasma display, an LED display, and the like, for displaying visual data and information. In accordance with another embodiment of the claimed subject matter, the portable device with flash memory 3220 manufactured according to the present invention, comprises cell phones, memory sticks, flash drive devices, video camcorders, voice recorders, USB flash drives, fax machines, flash memory laptops, MP3 players, digital cameras, home video game consoles, hard drives, memory cards (used as solid-state disks in laptops), and the like. The flash memory 3220 can include random access memory, read only memory, optical memory, audio memory, magnetic memory, and the like.

According to one embodiment of the present invention, the CPU 3208 is configured to communicate with the audio input device 3218, the audio output device 3216 and a display component 3226. The display component 3226 can be separate and distinct from the video display 3202. The CPU 3208 can execute control functions based on inputs from the user, entered using the input component 3204, for example. Based on those inputs, for example the display component can display a graph, a photo, a map, a chart, a video, and the like. The PDA 3200 is also configured to output data as an audio signal, for example a song, a message, a warning sound, various tones, recordings, etc. In another embodiment of the present invention the PDA 3200 can communicate with other electronic devices, for example computers, cell phones, other PDAs, and the like. The PDA 3200 is also configured to transmit digital data wirelessly from one user to another. This is done utilizing the transmitter/receiver 3210 to either transmit or receive data. Additionally, sensors 3222 can be utilized to sense data external to the PDA 3200, for example, temperatures, radiation levels, pressures, and the like.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The following is claimed:

1. A memory device, comprising:
an array of memory cells; and
a partitioning system configured to address a first portion of the array in a single level cell mode and a second portion of the array in a multi-level cell mode,
wherein the partitioning system is configured to distinguish between the first and second portions based on first and second programmable address pointers provided thereto,
wherein the partitioning system identifies all the memory cells in the array having addresses between the first and second programmable address pointers as the first portion and all remaining memory cells in the array as the second portion, and
wherein the first and second programmable address pointers comprise adjustable addresses stored in first and second registers, respectively, that are adjustable by a user input, thereby making the partitioning system configurable.

2. The memory device of claim 1, wherein the partitioning system comprises a partition control circuit configured to receive an address to be accessed within the array for a read or write operation, and enable the single level cell mode or the multi-level cell mode by comparing the address to the programmable address pointer.

3. The memory device of claim 2, wherein the partitioning system further comprises:
a programmable addressing circuit configured to perform a read or write operation to one or more cells in the array in a multi-level cell mode, and configured to perform a read or write operation to one or more cells in the array in a single level cell mode.

4. The memory device of claim 1, wherein the array of memory cells is configured in one of a NAND, NOR or virtual ground type array architecture.

5. A memory, comprising:
an array of memory cells; and
a configurable partitioning system configured to partition the array into first and second portions based on a configurable instruction,
wherein the first array portion is addressed differently than the second array portion,
wherein the configurable instruction comprises first and second programmable address pointers,
wherein the partitioning system is configured to partition a portion of the array having addresses between the first and second programmable address pointers as the first array portion and remaining memory cells in the array as the second array portion, and
wherein the first and second programmable address pointers comprise adjustable addresses stored in first and second registers, respectively, that are adjustable by a user input, thereby making the partitioning system configurable.

6. The memory of claim 5, wherein the partitioning system is configured to address the first array portion in a single level operation mode, and address the second array portion in a multi-level operation mode.

7. The memory of claim 6, wherein the partitioning system comprises a partition control circuit configured to receive an address to be accessed within the array for a read or write operation, and enable the single level cell mode or the multi-level cell mode by comparing the address to the first and second programmable address pointers.

8. The memory of claim 7, wherein the partitioning system further comprises:

a programmable addressing circuit configured to perform a read or write operation to one or more cells in the array in a multi-level cell mode, and configured to perform a read or write operation to one or more cells in the array in a single level cell mode.

* * * * *

UNITED STATES PATENT AND TRADEMARK OFFICE
CERTIFICATE OF CORRECTION

PATENT NO. : 8,832,408 B2  
APPLICATION NO. : 11/928865  
DATED : September 9, 2014  
INVENTOR(S) : Nazarian et al.

Page 1 of 1

It is certified that error appears in the above-identified patent and that said Letters Patent is hereby corrected as shown below:

On the Title page:

Item 75, Inventors, "Hills, CA (US)" should read --Emerald Hills, CA (US)--; and Item 56, References Cited, --International Search Report For Application # PCT/US2008/079969 Dated March 20, 2009.-- should be added.

Signed and Sealed this
Sixth Day of January, 2015

Michelle K. Lee
*Deputy Director of the United States Patent and Trademark Office*